United States Patent
Sugiura

(10) Patent No.: US 9,740,222 B2
(45) Date of Patent: Aug. 22, 2017

(54) OVERCURRENT PROTECTION CIRCUIT FOR CONTROLLING A GATE OF AN OUTPUT TRANSISTOR BASED ON AN OUTPUT CURRENT

(71) Applicant: Seiko Instruments Inc., Chiba-shi, Chiba (JP)

(72) Inventor: Masakazu Sugiura, Chiba (JP)

(73) Assignee: SII Semiconductor Corporation (JP)

( * ) Notice: Subject to any disclaimer, the term of this patent is extended or adjusted under 35 U.S.C. 154(b) by 72 days.

(21) Appl. No.: 14/693,425

(22) Filed: Apr. 22, 2015

(65) Prior Publication Data

US 2015/0311691 A1    Oct. 29, 2015

(30) Foreign Application Priority Data

Apr. 25, 2014 (JP) .................. 2014-091923

(51) Int. Cl.
G05F 1/56     (2006.01)
G05F 1/573    (2006.01)
H03K 17/082   (2006.01)

(52) U.S. Cl.
CPC ............. *G05F 1/56* (2013.01); *G05F 1/573* (2013.01); *H03K 17/0822* (2013.01)

(58) Field of Classification Search
CPC .......... G05F 1/46–1/468; G05F 1/573–1/5735
See application file for complete search history.

(56) References Cited

U.S. PATENT DOCUMENTS 8,169,204 B2 *  5/2012  Jian .................. G05F 1/573
                                                323/273
2010/0079121 A1 * 4/2010 Yanagawa ........... G05F 1/575
                                                323/277

FOREIGN PATENT DOCUMENTS

JP              4-195613 A    7/1992

* cited by examiner

*Primary Examiner* — Harry Behm
*Assistant Examiner* — Peter Novak
(74) *Attorney, Agent, or Firm* — Brinks Gilson & Lione

(57) ABSTRACT

To provide an overcurrent protection circuit which prevents an excessive current from flowing to an output terminal for a long time, and a semiconductor device and a voltage regulator each equipped with the overcurrent protection circuit. An overcurrent protection circuit is configured to include a first transistor which allows a current proportional to an output current flowing through an output transistor to flow, a constant current circuit which allows a reference current to flow, a comparison circuit which compares the current flowing through the first transistor and the reference current, and a control circuit which controls a gate of the output transistor by a signal outputted from the comparison circuit.

6 Claims, 4 Drawing Sheets

OVERCURRENT PROTECTION CIRCUIT FOR CONTROLLING A GATE OF AN OUTPUT TRANSISTOR BASED ON AN OUTPUT CURRENT

RELATED APPLICATIONS

This application claims priority under 35 U.S.C. §119 to Japanese Patent Application No. 2014-091923 filed on Apr. 25, 2014, the entire contents of which is hereby incorporated by reference.

BACKGROUND OF THE INVENTION

Field of the Invention

The present invention relates to an overcurrent protection circuit, and a semiconductor device and a voltage regulator both equipped with the overcurrent protection circuit.

Background Art

A voltage regulator equipped with a related art overcurrent protection circuit will be described. FIG. 4 is a circuit diagram illustrating the voltage regulator equipped with the related art overcurrent protection circuit. The related art voltage regulator is equipped with a reference voltage circuit 401, NMOS transistors 403, 404, and 405, PMOS transistors 402, 406, and 110, resistors 204 and 205, a power supply terminal 101, a ground terminal 100, and an output terminal 102.

When a reference voltage Vref of the reference voltage circuit 401 is larger than a divided voltage Vfb obtained by dividing an output voltage Vout of the output terminal 102 by the resistors 204 and 205, the potential of a gate of the PMOS transistor 110, which is equivalent to the output of an error amplifier circuit configured by the NMOS transistors 403, 404, and 405, and the PMOS transistors 402 and 406, is lowered to reduce the on resistance of the PMOS transistor 110. Then, the voltage regulator is operated to raise the output voltage Vout and thereby equalize the divided voltage Vfb and the reference voltage Vref each other. When the reference voltage Vref is smaller than the divided voltage Vfb, the potential of the gate of the PMOS transistor 110, which is equivalent to the output of the error amplifier circuit, is made high to increase the on resistance of the PMOS transistor 110. Then, the voltage regulator is operated to reduce the output voltage Vout and thereby equalize the divided voltage Vfb and the reference voltage Vref each other.

The voltage regulator generates a constant output voltage Vout by always holding the divided voltage Vfb and the reference voltage Vref equally (refer to, for example, Patent Document 1 and FIG. 2).

[Patent Document 1]
Japanese Patent Application Laid-Open No. Hei 4 (1992)-195613

SUMMARY OF THE INVENTION

The related art voltage regulator is however accompanied by a problem that when an excessive current continues to flow to the output terminal, the PMOS transistor 110 generates heat and is destroyed.

The present invention has been made in view of the above problems and provides an overcurrent protection circuit which prevents an excessive current from flowing to an output terminal for a long time, and a semiconductor device and a voltage regulator both equipped with the overcurrent protection circuit.

In order to solve the related art problems, an overcurrent protection circuit according to one aspect of the present invention, and a semiconductor device and a voltage regulator both equipped with the overcurrent protection circuit are configured as follows.

There is provided a configuration having a first transistor which allows a current proportional to an output current flowing through an output transistor to flow, a constant current circuit which allows a reference current to flow, a comparison circuit which compares the current flowing through the first transistor and the reference current, and a control circuit which controls a gate of the output transistor by a signal outputted from the comparison circuit.

It is possible to prevent an output transistor from breaking down when an overcurrent flows to an output terminal, without causing trouble in the control of a driving circuit.

DETAILED DESCRIPTION OF THE PREFERRED EMBODIMENTS

First Embodiment

Figure 1:
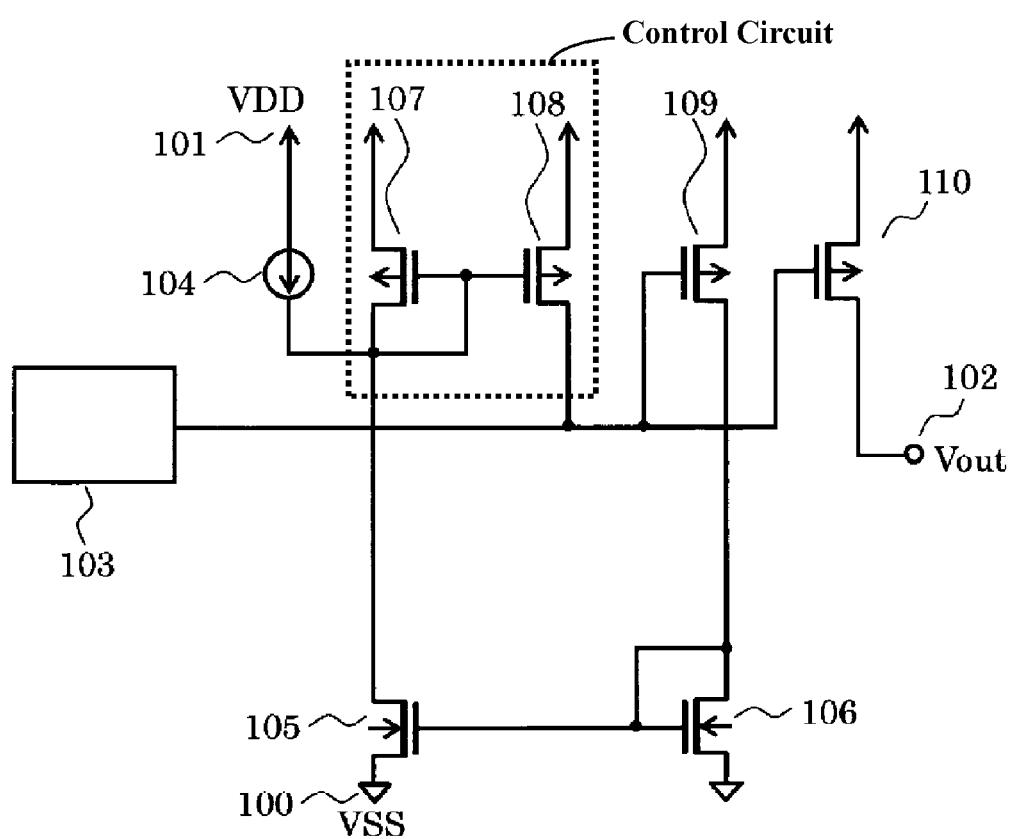
FIG. 1 is a circuit diagram of a semiconductor device equipped with an overcurrent protection circuit of the present invention.

FIG. 1 is a circuit diagram of a semiconductor device equipped with an overcurrent protection circuit of the present invention.

The semiconductor device equipped with the overcurrent protection circuit of the present invention includes a driving circuit 103, a constant current circuit 104, NMOS transistors 105 and 106, PMOS transistors 107, 108, 109, and 110, a power supply terminal 101, a ground terminal 100, and an output terminal 102.

A description will be made about the connections of the semiconductor device equipped with the overcurrent protection circuit of the present invention. The output of the driving circuit 103 is connected to a drain of the PMOS transistor 108, a gate of the PMOS transistor 109, and a gate of the PMOS transistor 110. The PMOS transistor 108 has a gate connected to a gate and drain of the PMOS transistor 107, and a source connected to the power supply terminal 101. A source of the PMOS transistor 107 is connected to the power supply terminal 101. The constant current circuit 104 has one terminal connected to the power supply terminal 101, and the other terminal connected to the gate and drain of the PMOS transistor 107. The NMOS transistor 105 has a gate connected to a gate and drain of the NMOS transistor 106, a drain connected to the gate and drain of the PMOS transistor 107, and a source connected to the ground terminal 100. A source of the NMOS transistor 106 is connected to the ground terminal 100. The PMOS transistor 109 has a drain connected to the gate and drain of the NMOS transistor 106, and a source connected to the power supply terminal

101. The PMOS transistor 110 has a drain connected to the output terminal 102, and a source connected to the power supply terminal 101.

A description will next be made about the operation of the semiconductor device equipped with the overcurrent protection circuit of the present invention. When a power supply voltage VDD is inputted to the power supply terminal 101, the driving circuit 103 is operated to control the operation of the PMOS transistor 110 operated as an output transistor with the output of the driving circuit 103. When the PMOS transistor 110 is operated by the output of the driving circuit 103, an output voltage Vout is generated at the output terminal 102.

When a load is connected to the output terminal 102 when the PMOS transistor 110 is operating, the PMOS transistor 109 allows a current Imon proportional to a current flowing through the PMOS transistor 110 to flow. The NMOS transistor 106 and the NMOS transistor 105 configure a current mirror and generate a current Imon1 obtained by copying the current Imon at an arbitrary magnification. The constant current circuit 104 supplies a reference current Ia, which is compared with the output current Imon1 of the NMOS transistor 105.

When Imon1>Ia, the PMOS transistor 107 allows a current of Imon1−Ia to flow. Then, this current is amplified to an arbitrary magnification by a current mirror configured by the PMOS transistors 107 and 108. The current mirror is operated to allow current to flow through the PMOS transistor 108 and turn off the PMOS transistor 110. Incidentally, since the current for charging the gate of the PMOS transistor 110 increases as the difference between Imon1 and Ia becomes larger, the PMOS transistor 110 is quickly turned off. When the difference between Imon1 and Ia is small, the PMOS transistor 110 is turned off slowly. When Imon1<Ia, no current flows through the PMOS transistor 107. Therefore, the PMOS transistor 110 is no longer turned off.

Thus, when the load is connected to the output terminal 102 and an overcurrent flows in the PMOS transistor 110, the PMOS transistor 110 is turned off to make it possible to prevent the PMOS transistor 110 from breaking down. Since the speed of turning off the PMOS transistor 110 is determined depending on the magnitude of the current flowing through the PMOS transistor 108, and the present current does not increase suddenly, the PMOS transistor 110 is not turned off immediately even if the current flowing through the PMOS transistor 110 is controlled so as to increase instantaneously by the driving circuit 103. Therefore, in this regard, trouble is not generated in the control of the driving circuit 103.

Incidentally, although the current mirror configured by the NMOS transistor 106 and the NMOS transistor 105 is used as the circuit for comparing the current Imon1 and the reference current Ia, the present embodiment is not limited to this configuration, but any comparison circuit may be adopted if there are provided circuits each capable of comparing the current Imon1 and the reference current Ia. Also, although the current mirror is used as the circuit which copies the current flowing through the PMOS transistor 107 at the arbitrary magnification, the present embodiment is not limited to this configuration, but any current amplifier circuit may be adopted if there are provided circuits each of which copies the current at an arbitrary magnification. There may be used, for example, a voltage comparator which compares a voltage generated by the flow of a current proportional to the current flowing through the PMOS transistor 110 through a resistor, and a reference voltage generated by the flow of a reference current through the resistor, and a control circuit which controls the gate of the PMOS transistor 110 by an output signal of the voltage comparator.

As described above, the semiconductor device equipped with the overcurrent protection circuit of the present invention is capable of preventing the output transistor from breaking down when the overcurrent flows to the output terminal, without causing trouble in the control of the driving circuit.

Second Embodiment

Figure 2:
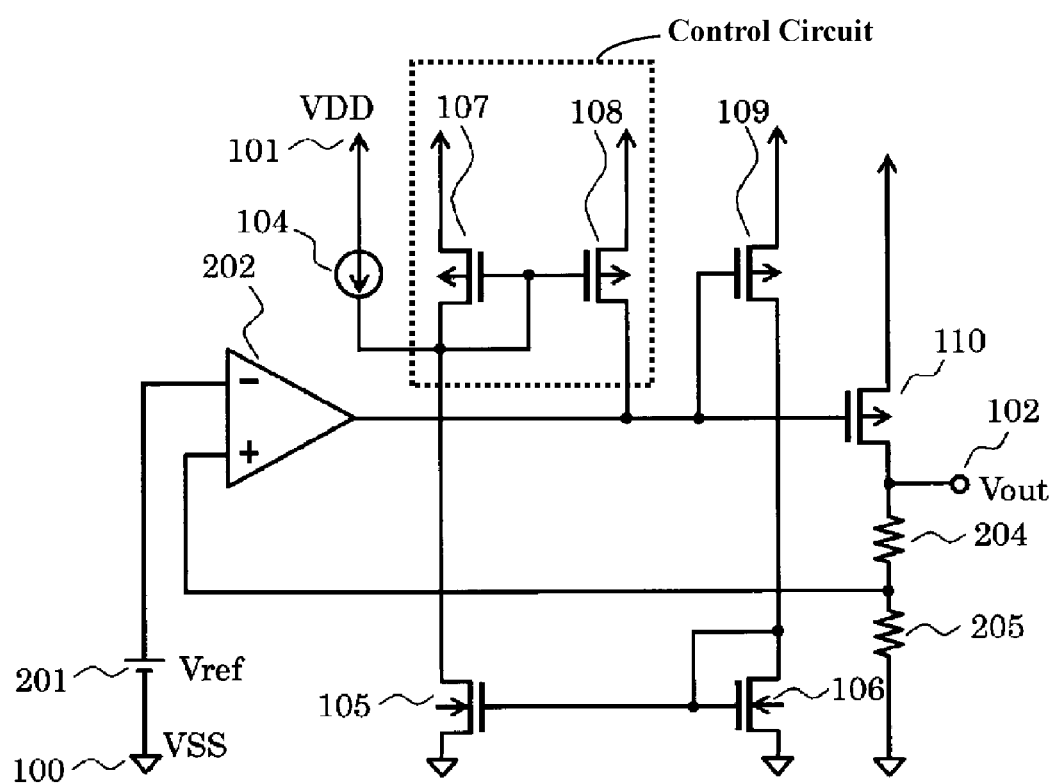
FIG. 2 is a circuit diagram of a voltage regulator equipped with an overcurrent protection circuit of the present invention.

FIG. 2 is a circuit diagram of a voltage regulator equipped with an overcurrent protection circuit of the present invention. FIG. 2 is different from FIG. 1 in that the driving circuit 103 is omitted and a reference voltage circuit 201, resistors 204 and 205, and an error amplifier circuit 202 are added. For their connections, the error amplifier circuit 202 has an inversion input terminal connected to a positive electrode of the reference voltage circuit 201, a non-inversion input terminal connected to a connection point of the resistors 204 and 205, and an output connected to the drain of the PMOS transistor 108, the gate of the PMOS transistor 109, and the gate of the PMOS transistor 110. A negative electrode of the reference voltage circuit 201 is connected to the ground terminal 100. The other terminal of the resistor 204 is connected to the output terminal 102, and the other terminal of the resistor 205 is connected to the ground terminal 100. Others are similar to FIG. 1.

A description will be made about the operation of the voltage regulator equipped with the overcurrent protection circuit of the present invention. When the power supply voltage VDD is inputted to the power supply terminal 101, the voltage regulator outputs an output voltage Vout from the output terminal 102. The resistors 204 and 205 divide the output voltage Vout and output a divided voltage Vfb. The error amplifier circuit 202 compares a reference voltage Vref of the reference voltage circuit 201 and the divided voltage Vfb and controls a gate voltage of the PMOS transistor 110 operated as an output transistor in such a manner that the output voltage Vout becomes constant.

When the output voltage Vout is higher than a predetermined voltage, the divided voltage Vfb becomes higher than the reference voltage Vref. Thus, since the output signal (potential of the gate of the PMOS transistor 110) of the error amplifier circuit 202 becomes high and the PMOS transistor 110 is turned off, the output voltage Vout becomes low. Further, when the output voltage Vout is lower than the predetermined voltage, the voltage regulator performs an operation opposite to the above to make the output voltage Vout high. Thus, the voltage regulator is operated such that the output voltage Vout becomes constant.

Consider when a load is connected to the output terminal 102, and an overcurrent flows thereto. The PMOS transistor 109 allows a current Imon proportional to a current flowing in the PMOS transistor 110 to flow. The NMOS transistor 106 and the NMOS transistor 105 configure a current mirror and generate a current Imon1 obtained by copying the current Imon at an arbitrary magnification. The constant current circuit 104 supplies a reference current Ia, which is compared with the output current Imon1 of the NMOS transistor 105.

When Imon1>Ia, the PMOS transistor 107 allows a current of Imon1−Ia to flow. Then, this current is amplified to an arbitrary magnification by a current mirror configured by the PMOS transistors 107 and 108. The current mirror is operated to supply current to the PMOS transistor 108 and turn off the PMOS transistor 110. Incidentally, since the current for charging the gate of the PMOS transistor 110 increases as the difference between Imon1 and Ia becomes larger, the PMOS transistor 110 is quickly turned off. When the difference between Imon1 and Ia is small, the PMOS transistor 110 is turned off slowly. When Imon1<Ia, no current flows through the PMOS transistor 107. Therefore, the PMOS transistor 110 is no longer turned off.

Thus, when the load is connected to the output terminal 102 and an overcurrent flows in the PMOS transistor 110, the PMOS transistor 110 is turned off to make it possible to prevent the PMOS transistor 110 from breaking down. Since the speed of turning off the PMOS transistor 110 is determined depending on the magnitude of the current flowing through the PMOS transistor 108, and this current does not increase suddenly, the PMOS transistor 110 is not turned off immediately even if the current flowing through the PMOS transistor 110 is controlled so as to increase instantaneously by the error amplifier circuit 202. Although the error amplifier circuit 202 controls the PMOS transistor 110 so that a large current flows therethrough when the load of the output terminal is changed from a light load to a heavy load, for example, this point does not cause trouble in this control.

Incidentally, although the current mirror configured by the NMOS transistor 106 and the NMOS transistor 105 is used as the circuit for comparing the current Imon1 and the reference current Ia, the present embodiment is not limited to this configuration, but any comparison circuit may be adopted if there are provided circuits each capable of comparing the current Imon1 and the reference current Ia. Also, although the current mirror is used as the circuit which copies the current flowing through the PMOS transistor 107 at the arbitrary magnification, the present embodiment is not limited to this configuration, but any current amplifier circuit may be adopted if there are provided circuits each of which copies the current flowing through the PMOS transistor 107 at an arbitrary magnification. There may be used, for example, a voltage comparator which compares a voltage generated by the flow of a current proportional to the current flowing through the PMOS transistor 110 through a resistor, and a reference voltage generated by the flow of a reference current through the resistor, and a control circuit which controls the gate of the PMOS transistor 110 by an output signal of the voltage comparator.

As described above, the voltage regulator equipped with the overcurrent protection circuit of the present invention is capable of preventing the output transistor from breaking down when the overcurrent flows to the output terminal, without causing trouble in the control of the error amplifier circuit.

Figure 3:
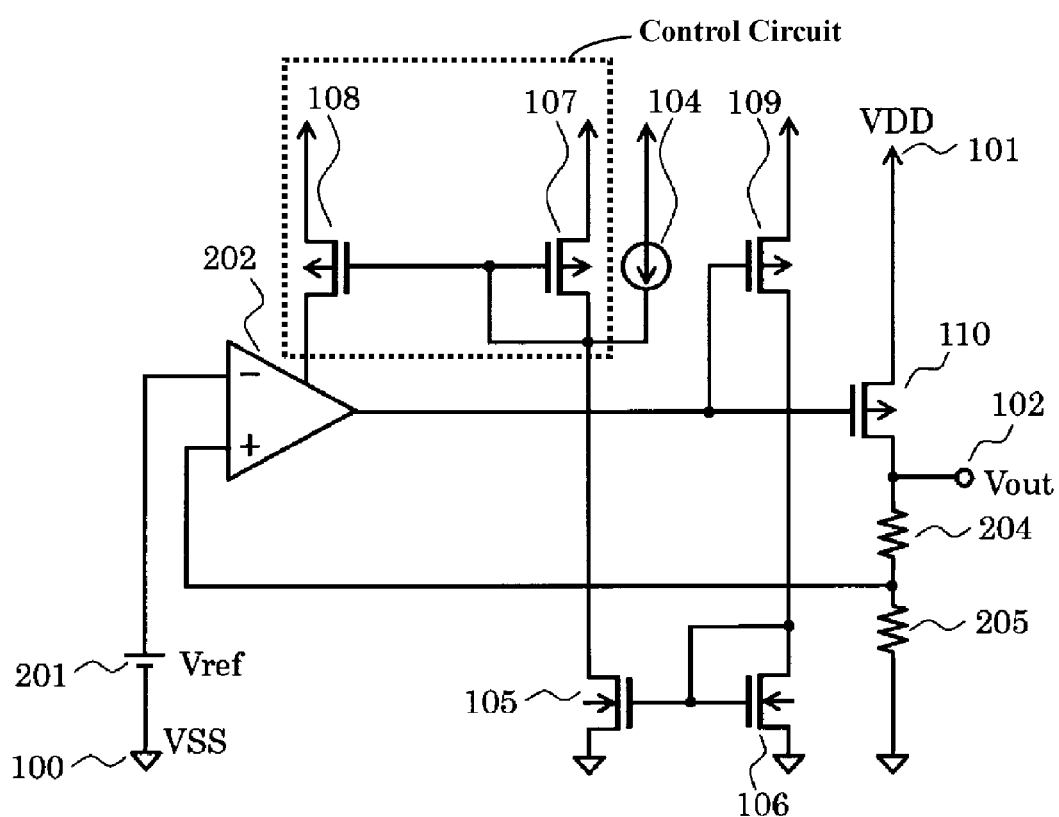
FIG. 3 is a circuit diagram illustrating another example of a voltage regulator equipped with an overcurrent protection circuit of the present invention.
Figure 4:
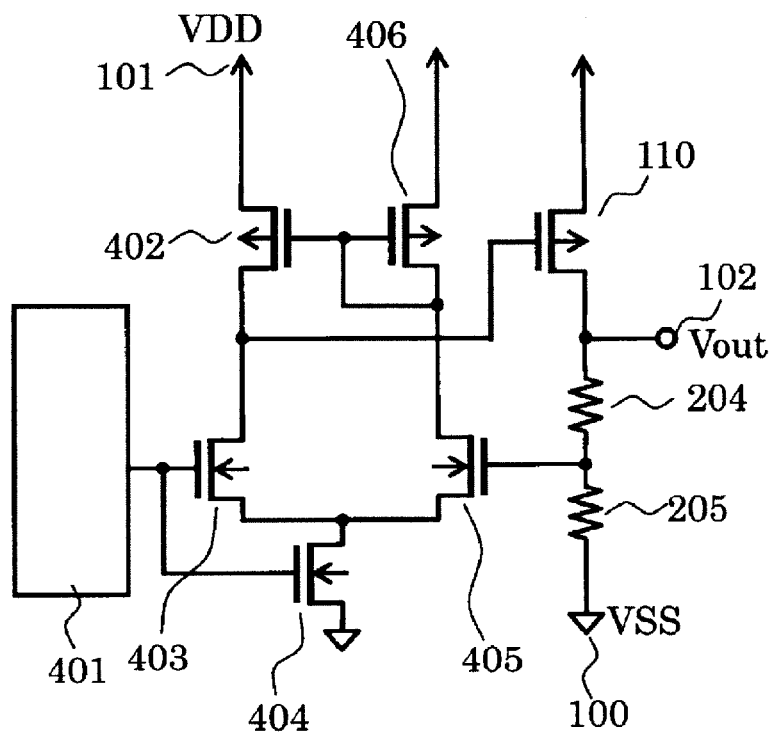
FIG. 4 is a circuit diagram of a related art voltage regulator.

FIG. 3 is a circuit diagram illustrating another example of a voltage regulator equipped with an overcurrent protection circuit of the present invention. FIG. 3 is different from FIG. 2 in that the drain of the PMOS transistor 108 is connected so as to increase a bias current of the error amplifier circuit 202.

The operation of the voltage regulator illustrated in FIG. 3 will be described. The normal operation is similar to that of the voltage regulator illustrated in FIG. 2. When a load is connected to the output terminal 102 and an overcurrent flows thereto, the PMOS transistor 109 allows a current Imon proportional to a current flowing through the PMOS transistor 110. The NMOS transistor 106 and the NMOS transistor 105 configure a current mirror and generate a current Imon1 obtained by copying the current Imon at an arbitrary magnification. The constant current circuit 104 supplies a reference current Ia, which is compared with the output current Imon1 of the NMOS transistor 105.

When Imon1>Ia, the PMOS transistor 107 allows a current of Imon1−Ia to flow. Then, this current is amplified to an arbitrary magnification by a current mirror configured by the PMOS transistors 107 and 108 and makes a current to flow through the PMOS transistor 108 to thereby increase the bias current of the error amplifier circuit 202. Then, the error amplifier circuit 202 is improved in response and operated to turn off the PMOS transistor 110 under its control. Incidentally, since the bias current of the error amplifier circuit 202 increases as the difference between Imon1 and Ia becomes larger, the response of the error amplifier circuit 202 is further improved so that the control of turning off the PMOS transistor 110 is made fast. Further, since the increase in the bias current of the error amplifier circuit 202 becomes slight when the difference between Imon1 and Ia is small, the response of the error amplifier circuit 202 increases slightly and hence the control of turning off the PMOS transistor 110 is made slightly faster than when the bias current of the error amplifier circuit 202 does not increase. When Imon1<Ia, no current flows through the PMOS transistor 107. Therefore, the bias current of the error amplifier circuit 202 is no longer increased.

Thus, when the load is connected to the output terminal 102 and the overcurrent flows through the PMOS transistor 110, the bias current of the error amplifier circuit 202 is increased to turn off the PMOS transistor 110 under the control of the error amplifier circuit 202, thereby making it possible to prevent the PMOS transistor 110 from breaking down. Since the speed of turning off the PMOS transistor 110 is determined depending on the magnitude of the current flowing through the PMOS transistor 108, and since this current does not increase suddenly and increases in stages, the bias current of the error amplifier circuit 202 is not suddenly increased either but is increased in stages. Therefore, it is possible to attain compatibility between a stable operation of the error amplification circuit 202 at the viewpoint of its oscillation margin, which is not impeded excessively immediately, and an improvement in response by the increase in the bias current, thereby making it possible to solve the problem of the present application. More specifically, the stable operation and response speed of the error amplifier circuit 202 which tries to increase the potential of the gate of the PMOS transistor 110 are made compatible based on an output voltage Vout raised to supply an excessive load by the PMOS transistor 110 when the overcurrent flows through the PMOS transistor 110, for example, thereby making it possible to prevent an excessive current from flowing through the output transistor 110 for a long time.

Incidentally, although the current mirror configured by the NMOS transistor 106 and the NMOS transistor 105 is used as the circuit for comparing the current Imon1 and the reference current Ia, the present embodiment is not limited to this configuration, but any comparison circuit may be adopted if there are provided circuits each capable of comparing the current Imon1 and the reference current Ia. Also, although the current mirror is used as the circuit which copies the current flowing through the PMOS transistor 107 at the arbitrary magnification, the present embodiment is not limited to this configuration, but any current amplifier circuit may be adopted if there are provided circuits each of which copies the current at an arbitrary magnification. There may be used, for example, a voltage comparator which compares a voltage generated by the flow of a current proportional to the current flowing through the PMOS transistor 110 through a resistor, and a reference voltage generated by the flow of a reference current through the resistor, and a control circuit which controls the bias current of the error amplifier circuit 202 by an output signal of the voltage comparator.

As described above, the voltage regulator equipped with the overcurrent protection circuit of the present invention is capable of preventing the output transistor from breaking down when the overcurrent flows to the output terminal, without causing trouble in the control of the error amplifier circuit.

What is claimed is:

1. An overcurrent protection circuit, comprising:
a first transistor which allows a current proportional to an output current flowing through an output transistor to flow;
a constant current circuit which allows a reference current to flow;
a comparison circuit which compares the current flowing through the first transistor and the reference current; and
a control circuit which controls a gate of the output transistor by a signal outputted from the comparison circuit, the control circuit connected to the constant current circuit and the output transistor,
wherein the control circuit is a current amplifier circuit which includes a fourth transistor having a gate and drain connected to the constant current circuit, and a fifth transistor having a gate connected to the gate of the fourth transistor, and a drain connected to the gate of the output transistor, and configures a current mirror;
wherein the control circuit controls a turn-off speed of the output transistor based on a magnitude of a current flowing through the fifth transistor.

2. The overcurrent protection circuit according to claim 1, wherein the comparison circuit includes a second transistor having a gate and drain connected to a drain of the first transistor, and a third transistor having a gate connected to the gate of the second transistor and a drain connected to the constant current circuit, and configures a current mirror, and
wherein the comparison circuit compares the reference current and a current of the third transistor.

3. A semiconductor device, comprising:
an output transistor which outputs an input voltage to an output terminal;
a driving circuit which controls the operation of the output transistor; and
the overcurrent protection circuit according to claim 1.

4. A voltage regulator, comprising:
an output transistor which outputs a predetermined output voltage to an output terminal;
an error amplifier circuit which amplifies and outputs a difference between a divided voltage obtained by dividing the output voltage and a reference voltage, and controls the gate of the output transistor; and
the overcurrent protection circuit according to claim 1.

5. A voltage regulator, comprising:
an output transistor which outputs a predetermined output voltage to an output terminal;
an error amplifier circuit which amplifies and outputs a difference between a divided voltage obtained by dividing the output voltage and a reference voltage, and controls a gate of the output transistor; and
an overcurrent protection circuit,
wherein the overcurrent protection circuit includes a first transistor which allows a current proportional to an output current flowing through the output transistor to flow,
a constant current circuit which allows a reference current to flow;
a comparison circuit which compares the current flowing through the first transistor and the reference current, and
a control circuit which controls a bias current of the error amplifier circuit by a signal outputted from the comparison circuit, the control circuit connected to the constant current circuit and the output transistor,
wherein the control circuit is a current amplifier circuit which includes a fourth transistor having a gate and drain connected to the constant current circuit, and a fifth transistor having a gate connected to the gate of the fourth transistor, and a drain connected to the error amplifier circuit, and configures a current mirror;
wherein the control circuit controls a turn-off speed of the output transistor based on a magnitude of a current flowing through the fifth transistor.

6. The voltage regulator according to claim 5, wherein the comparison circuit includes a second transistor having a gate and drain connected to a drain of the first transistor, and a third transistor having a gate connected to the gate of the second transistor and a drain connected to the constant current circuit, and configures a current mirror, and
wherein the comparison circuit compares the reference current and a current of the third transistor.

* * * * *